United States Patent [19]

Thompson

[11] Patent Number: 4,633,119
[45] Date of Patent: Dec. 30, 1986

[54] BROADBAND MULTI-RESONANT LONGITUDINAL VIBRATOR TRANSDUCER

[75] Inventor: Stephen C. Thompson, Euclid, Ohio

[73] Assignee: Gould Inc., Rolling Meadows, Ill.

[21] Appl. No.: 744,739

[22] Filed: Jun. 14, 1985

Related U.S. Application Data

[63] Continuation-in-part of Ser. No. 626,784, Jul. 2, 1984, abandoned.

[51] Int. Cl.$^4$ ............................................. H01L 41/08
[52] U.S. Cl. .................................... 310/325; 310/321; 310/322; 310/334; 310/337
[58] Field of Search ............... 310/321, 323, 325, 326, 310/334–337, 345; 367/158, 162

[56] References Cited

U.S. PATENT DOCUMENTS

| | | | |
|---|---|---|---|
| 3,714,475 | 1/1973 | Baker, Jr. ............................ | 310/321 |
| 3,873,947 | 3/1975 | Johnson ........................... | 310/321 X |
| 3,890,591 | 6/1975 | Bocquillon ...................... | 310/325 X |
| 3,952,216 | 4/1976 | Madison et al. .................... | 310/325 |
| 4,240,003 | 12/1980 | Larson, III ..................... | 310/334 X |
| 4,373,143 | 2/1983 | Lindberg ............................. | 310/334 |
| 4,490,640 | 12/1984 | Honda .............................. | 310/322 X |

*Primary Examiner*—Mark O. Budd

[57] ABSTRACT

A broadband longitudinal vibrator transducer having a laminar head mass section including at least three layers coupled to electromechanical transducer elements. The head section includes a forward head mass, a compliant member abutting the forward head mass and a rear head mass abutting both the compliant member and the transducer elements. The compliant member allows the head mass section to mechanically resonate in at least two frequencies expanding the bandwidth of the transducer. The compliant member can be an active transducer element.

8 Claims, 9 Drawing Figures

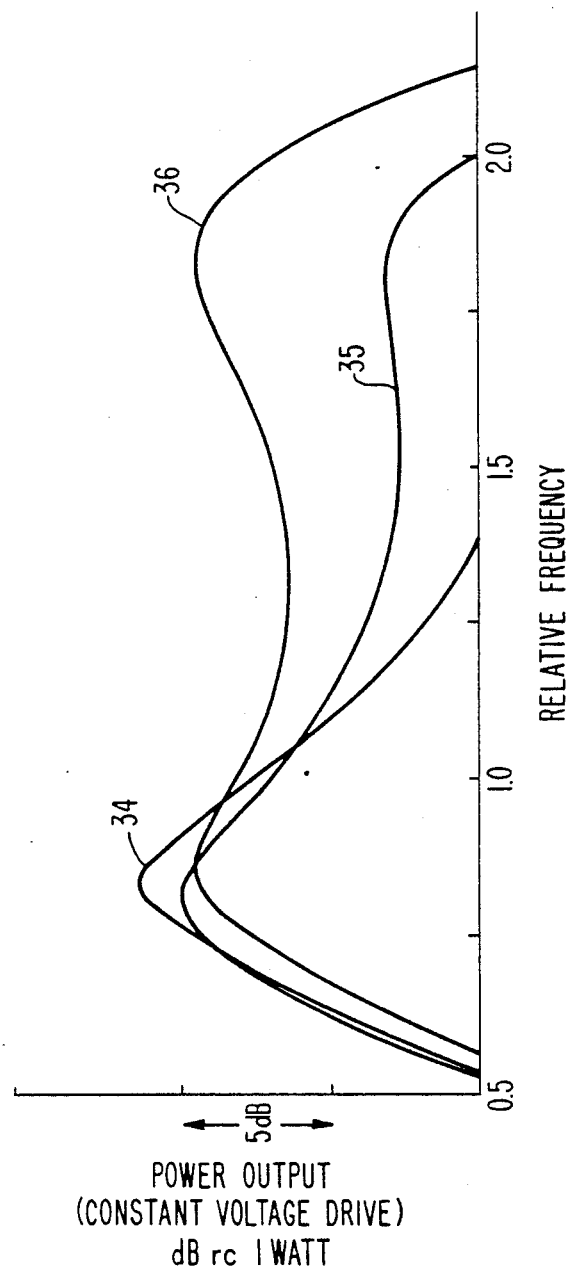

BROADBAND MULTI-RESONANT LONGITUDINAL VIBRATOR TRANSDUCER

This application is a continuation-in-part of application Ser. No. 626,784, filed 7/2/84, now abandoned.

BACKGROUND OF THE INVENTION

1. Field of the Invention

This invention relates to an electromechanical transducer and, more particularly, to a transducer commonly known as a mass loaded longitudinal vibrator transducer having the dominant mechanical motion in a single direction and which includes head masses alternating with compliant layers where one of the compliant layers can be an active transducer element.

2. Description of the Related Art

A device commonly known as a "longitudinal vibrator" is one of the simplest and most widely used electromechanical or electroacoustical transducer types. Such a device, in its simplest form, consists merely of a thin piece of active material which can be driven electrically to induce a planar motion therein. For example, a flat disc or ring made of a piezoelectric ceramic (such as a lead zirconate titanate formulation) which has electrodes on its flat surfaces and is polarized in the direction normal to the flat surfaces may act as a vibrator. This type of device is usually operated at its first longitudinal resonance frequency to achieve a higher output. To achieve a reasonably low resonance frequency and a well controlled response in a compact device, it is common practice to mass load the two sides of the active material with inactive material pieces.

An example of a prior art double mass loaded longitudinal vibrator is shown in FIG. 1(a). Piezoelectric material rings 1 are bonded into a composite stack 2 and electrically wired in parallel so that when a voltage is applied between the electrical leads, all of the rings expand or contract in unison along with longitudinal axis of the device. A single vibrating head mass element 3 having a forward face 4 acts as the radiating surface and as a load on the forward end of the stack. Tail mass 5 is attached to the other end of the stack and is normally higher in mass than the head 3 to cause the predominant motion to be in the head 3. A stress rod or pretension bolt 6 and an associated nut 7 are used to join the components and to provide a compressive bias to the stack 2 of active elements.

The device of FIG. 1(a) may be used as either a generator or receiver of mechanical or acoustic energy and is normally operated in a frequency band approximately centered on its primary mechanical resonance frequency. At the primary resonance frequency, the head mass 3 and tail mass 5 move in opposite relative directions while the stack of active material alternately expands and contracts along its length.

It is well known by those of ordinary skill in the art that the performance of the conventional transducer in FIG. 1(a) can be approximated by the analogous behavior of a simplified electrical equivalent circuit, as shown in FIG. 1(b). In the circuit, $M_h$ and $M_t$ represent the head and tail mass, respectively. The transformer represents the electromechanical transformation property of the piezoelectric material. The turns ratio $\phi$ of this transformer is the electromechanical transformation ratio. The compliance of the ceramic stack 2 is represented by the capacitor C, and $C_0$ represents the actual electrical capacitance of the stack. The electrical components to the right of the transformer represent mechanical components while those to the left represent actual electrical components. The box at the right of the equivalent circuit represents the electrical equivalent of the radiation impedance $Z_{rad}$ seen by the radiating face of the transducer. The equivalent current u in the radiation impedance represents the velocity of the moving face of the radiator.

The transmitting voltage response (TVR) of this prior art device is calculated from this equivalent circuit approximation and is proportional to the current u divided by the drive voltage E at the input to the transducer circuit. In determining the response of the device, as expressed by Equation (1) below, the radiator impedance can be neglected.

$$TVR \propto \frac{u}{E} = \frac{jwC\phi \left( \frac{M_t}{M_h + M_t} \right)}{1 - w^2 C \left( \frac{M_h M_t}{M_h + M_t} \right)} \quad (1)$$

The transmitting voltage response has a single peak near the frequency where the denominator of the expression becomes zero. This occurs at the resonance (angular) frequency $w_r$ as set forth in Equation 2 below:

$$w_r = \left[ \frac{1}{\left( \frac{M_h M_t}{M_h + M_t} \right) C} \right]^{\frac{1}{2}} \quad (2)$$

The method of analysis discussed above is well known in the transducer industry, as discussed in, for example, Leon Camp, *Underwear Acoustics*, Wiley & Sons, New York, 1970, pp. 142–150; and Berlincourt et al, "Piezoelectric and Piezoelectric Materials and Their Function and Transducers", *Physical Acoustics*, Vol. 1A, Academic Press, New York, 1964, pp. 246–253. More complete and accurate performance predictions for transducers can be obtained by using a computer model, such as developed by K. M. Farnham, obtainable from Transducer and Arrays Division, Naval Underwater Systems Center, New London Laboratory, in New London, Conn. A graph of a typical response curve, produced by the above-mentioned program, for the transducer of FIG. 1(a) is illustrated by curve 30 in FIG. 6. The bandwidth of such a device is 0.36 frequency units extending from 0.85 to 1.21 frequency units.

A significant drawback of the prior art transducer of FIG. 1(a) is the very low mechanical input impedance of the radiator face (which is hereafter called the head impedance) in the operating band at the resonant frequency. This low head impedance can cause problems when the transducer is used as an element in array configuration. As a practical limit, it is often necessary that the head impedance for elements in a high performance array be maintained at a magnitude sufficiently larger than the acoustic mutual impedances of the array for all possible operating frequencies. For this reason, it is often necessary to preclude operation in a narrow frequency band near the peak of the response.

The basic device, as shown in FIG. 1(a) also has significant practical limits to the achievable frequency bandwidth. The operating bandwidth can be increased by simultaneously reducing the mass of the head section and increasing the mechanical compliance of the ceramic stack. This results in a thinner head section and a ceramic stack which is smaller in cross-sectional area and/or greater in length. However, this design technique is limited by the following practical design considerations. As the radiating face becomes thinner, its first flexural resonance frequency will encroach on the operating band and drastically alter the radiation behavior of the unit. As the active material becomes thinner and/or longer, the device becomes mechanically fragile. As the active material becomes longer to maintain the desired resonance frequency, its length will become a significant fraction of the mechanical wavelength in the material, at which point the material is self-resonant and does not drive the medium.

In an effort to broaden the operating bandwidth of mass loaded longitudinal vibrators, a number of techniques have been attempted. One technique uses electrical components, such as inductors or capacitors, connected between the electrical terminals of the transducer and associated amplifier circuits to tune the response of the device. However, the modification using the special electrical termination can expand the bandwidth to a limited extent at the cost of increased size, weight and complexity. In addition, this method may produce localized high voltages at some circuit nodes requiring costly high voltage isolation and shielding. Curve 31 in FIG. 6 illustrates the response which is typical when a transducer is operated with an inductor in series with its electrical leads. As with the untuned transducer, the tuned transducer when operated in an array configuration encounters significant practical problems in the frequency range near each of the response peaks. However, this design offers a significant bandwidth between the peaks which is free from array problems caused by low head impedance. The 3 dB bandwidth around the dip between the two peaks extends from 0.81 to 1.20 relative frequency units and has a width of 0.39 frequency units.

Another well known technique for broadening the operating bandwidth of a transducer is to use external matching layers. The acoustic impedance of the transducer and the medium are matched through an external matching layer 8 as illustrated in FIG. 1(a) by the dashed lines. A design incorporating an external matching layer can achieve a significantly increased bandwidth as seen in curve 32 of FIG. 6. However, there are disadvantages to this approach. With external matching layers, the shape of the response curve is a fairly sensitive function of the density and sound speed of the matching layer material. In a particular application, it may not be possible to find an acceptable material having the desired material properties. In addition, the required matching layer thickness may be greater than is desired. Furthermore, in a design which incorporates an external matching layer, there will be two frequencies at which the head impedance becomes unacceptably low for operation in an array. For example, the transducer whose response is shown in curve 32 has an external matching layer of lucite and head impedance dips at relative frequencies of 0.80 and 1.78. Array operation would be inappropriate at either of these frequencies. Thus, the response shown has a useful bandwidth extending from 0.85 to 1.73 or 0.88 frequency units. If the head impedance dips can be tolerated, then the 3 dB bandwidth extends from 0.78 to 1.90 frequency units, a bandwidth of 1.12 units.

Another approach used in obtaining two resonant frequencies in a transducer is illustrated in FIG. 2. This device consists of a low frequency vibrator 10, a head mass 11 and a high frequency nonlinear array 12 nodally mounted on the head mass 11. In addition to being an extremely complex device requiring complex wiring and mounting systems, the device of FIG. 2 provides high power transmission in two widely spaced frequency bands more than two octaves apart. Each of the transducers 10 and 12 in this device operate as if the other were not present. However, the transducer of FIG. 2 cannot provide broadband response between the two resonance frequencies because there is an additional resonance in the transducer caused by the nodal mounting system of the high frequency units 12 on the head mass 11 of the low frequency unit 10. The resonance frequency of the nodal mounting system must occur at a frequency very much lower than the high frequency operating resonance to decouple the performance of the high frequency unit from the structure of the low frequency unit. In addition, the nodal mounting resonance frequency must be above the low frequency operating band or else it would act to decouple the low frequency radiator from the radiating medium. The acoustic reponse of the transducer undergoes a drastic decrease in the frequency range of the mounting system resonance. As a consequence, the prior art device of FIG. 2 cannot be used as a broadband transducer throughout the frequency range between the high and low frequency resonances because the nodal mounting resonance frequency must be between the two operating bands of the device. Thus, this device does not provide a true broadband transducer, but two separate frequency bands.

Other features of typical transducers, such as insulating washers, wiring, electrical contacts, etc., are well known by those of ordinary skill in the art and can be found in, for example, U.S. Pat. No. 3,309,654 to Miller.

SUMMARY OF THE INVENTION

It is an object of the present invention to provide a longitudinal vibrator transducer which can operate over a wider range of frequencies than previously possible.

It is another object of the present invention to provide a broad operating frequency bandwidth without special electrical termination components.

It is also an object of this invention to provide a transducer which can provide a single broad operating frequency band.

It is a further object of this invention to provide a transducer with a mechanical input impedance which is high at the radiating face throughout the operating band so that the transducer can be used in an array configuration.

It is another object of the present invention to provide a transducer that does not require a matching layer.

It is a further object of the present invention to provide a transducer with a high transmitting voltage response.

It is still an additional object of the present invention to provide a broadband frequency response wthout significant loss of efficiency.

It is a still further object of the present invention to provide a relatively flat response within the transducer operating band.

It is still an additional object of the present invention to provide a transducer which has substantially equal transmitted power levels at all frequencies in a wide operating band.

The present invention achieves the above objects by providing a transducer with a laminar head section which includes at least three layers. Two head mass layers are separated from each other by a compliant member. The compliant member in the head section can be an active transducer element. The head section is attached to active transducer elements which are attached to a tail mass. The complete transducer including the new composite head section has at least two resonance frequencies which can be approximated as the resonance frequency for the transducer if the compliant member in the head section were removed, and the resonance frequency of the head section alone if it were removed from the remainder of the transducer. The frequencies of these two resonances can be adjusted independently in a particular design as is appropriate for the desired application.

These, together with other objects and advantages, which will be subsequently apparent, reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

FIG. 7 depicts the transmitted power for general transducer configurations according to the present invention as compared to the prior art.

DESCRIPTION OF THE PREFERRED EMBODIMENTS

Figure 1A:
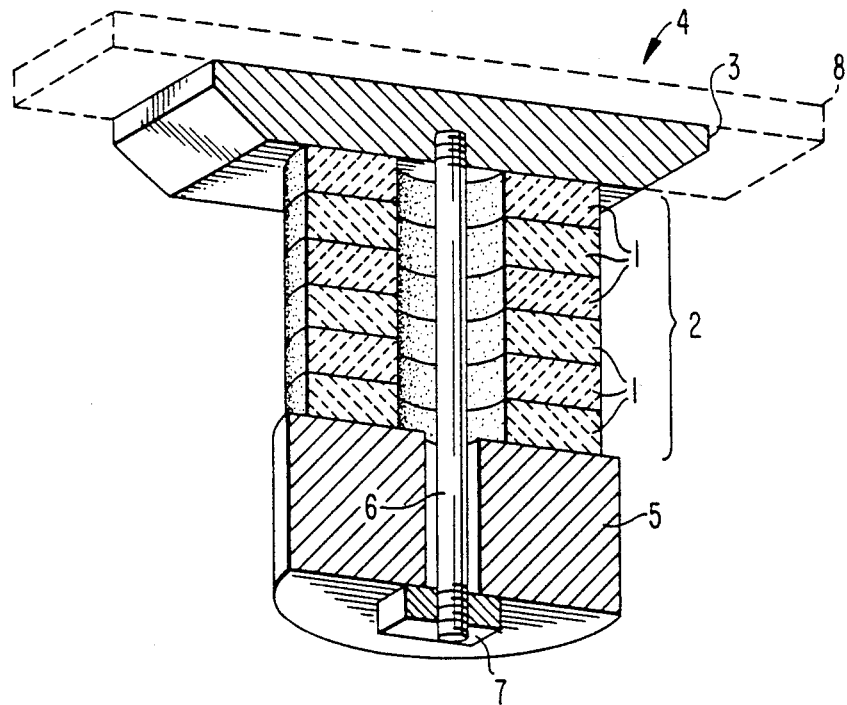
FIG. 1(a) depicts the elements and construction of a prior art transducer.
Figure 1B:
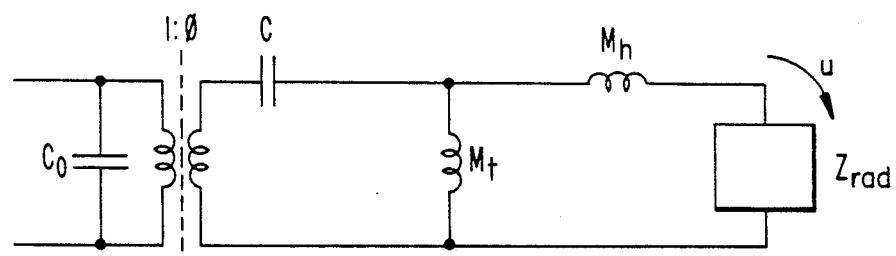
FIG. 1(b) is the equivalent electrical circuit for the transducer of FIG. 1(a)
Figure 2:
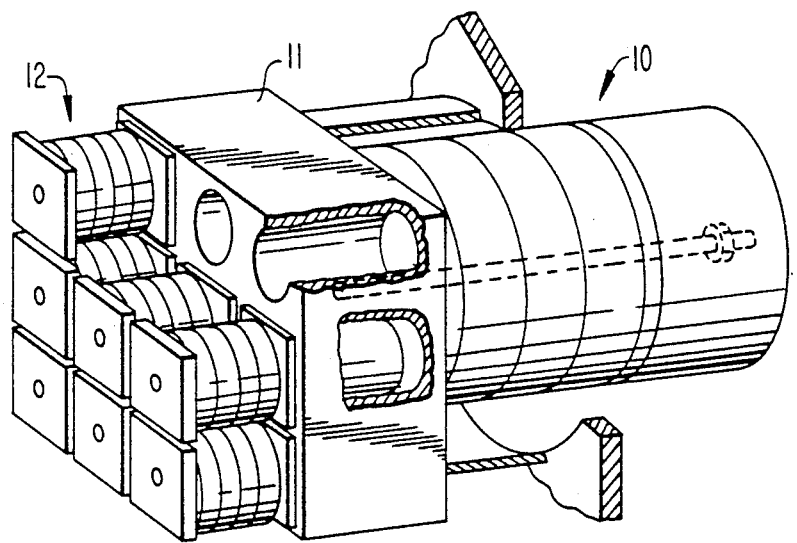
FIG. 2 illustrates a dual resonance frequency prior art device.
Figure 3:
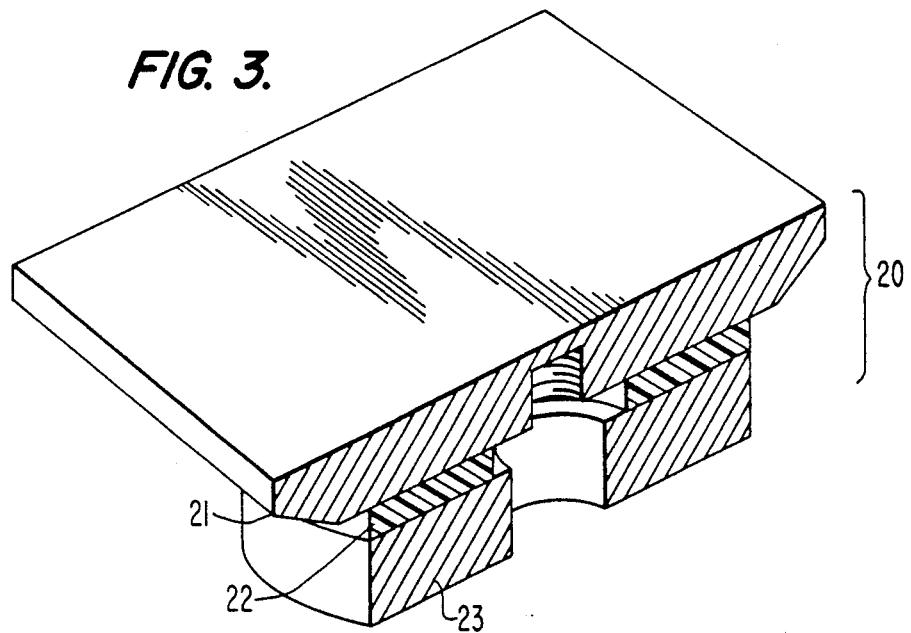
FIG. 3 illustrates the essential elements of the head section 20 of the transducer of the present invention.

The present invention achieves broadband operating frequency characteristics by replacing the monolithic mass head 3 of FIG. 1(a) with a mechanically resonant head section having a laminar structure with mass elements alternating with compliant members. The forwardmost part of the head section is in contact with the radiating medium and the aftmost part is connected to the remainder of the transducer just as a conventional monolithic head mass would be connected. FIG. 3 illustrates a trilaminar version of the head section 20 of the present invention where the forward head mass 21 and rear head mass 23 are made from a material strong enough to avoid bending resonance, such as aluminum, steel, a metal matrix composite or a graphite epoxy composite. A compliant member 22 is interposed between the forward 21 and rear 23 head masses. The compliant member can be a plastic, such as VESPEL, which is a polyimide plastic sold by DuPont or TORLON a polyamide-imide plastic sold by Amoco Chemical Corporation, an active transducer element or any other substance which provides the desired compliance. Although the compliant member 22 is shown as the same size as the rear head mass 23, it can be larger or smaller as needed. The head mass section 20 can be held together using ordinary epoxy glue, or tension coupling.

Figure 4A:
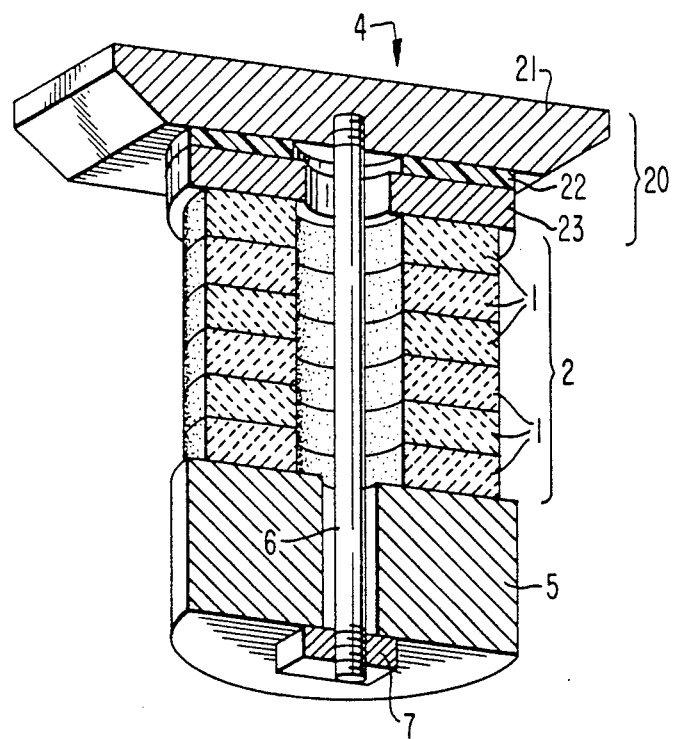
FIG. 4(a) illustrates the construction of a transducer using the head section 20 of FIG. 3.

FIG. 4(a) illustrates an assembled transducer using the trilaminar head section 20 of FIG. 3. The transducer elements 1 can be piezoelectric elements manufactured from a piezoelectric ceramic material, such a lead zirconate titanate formulation and can be obtained from Vernitron, Inc. in Bedford, Ohio. The tail mass 5, which can be tungsten, steel or aluminum, should be sufficiently massive to cause the predominant vibrational motion to occur in the head section 20. Each metal mass within the transducer must be substantially shorter than a quarter wave length at the highest frequency in the operating band. Stress rod 6 can be a copper beryllium, one-quarter hard, alloy No. 172 in accordnace with ASTM B-196 artifically aged to obtain Rockwell C39-42 after machining. The nut 7 can be of aluminum or steel, but must have a flat surface against the tail mass 5 so that no rocking of the nut occurs. The entire transducer can be assembled either by using epoxy and then tensioning the stress rod 6 or loosely assembled and held together by the stress rod 6. The adjustment of the compressive bias using the stress rod 6 is within the ordinary skill in the art.

Figure 4B:
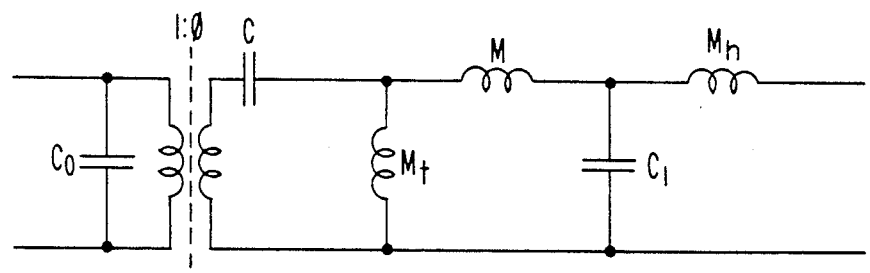
FIG. 4(b) is the equivalent electrical circuit for the transducer of FIG. 4(a)

An approximate equivalent electrical circuit for the transducer of FIG. 4(a) is illustrated in FIG. 4(b). In this equivalent circuit, $M_h$ is the forward head mass 21 of the head section 20 in contact with the medium. M is the mass of the rear head mass 23 in contact with the ceramic stack 2 and $M_t$ represents the tail mass 5 of the transducer. The electromechanical transformation ratio of the piezoelectric ceramic stack 2 is $\phi$. $C_0$ represents the actual electrical capacitance of the piezoelectric ceramic material, C represents the compliance of the ceramic stack 2 and $C_1$ represents the compliance of the compliant member 22 separating the forward 21 and rear 23 head masses. The transmitting voltage response for this transducer can be obtained from the following Equation 3:

$$TVR \propto \frac{u}{E} = \frac{jwC\phi\left(\frac{M_t}{M + M_h + M_t}\right)}{1 - w^2C\left(\frac{M_t(M + M_h)}{M + M_h + M_t}\right) - w^2C_1\left(\frac{M_h(M + M_t)}{M + M_h + M_t}\right) + w^4CC_1\left(\frac{MM_hM_t}{M + M_h + M_t}\right)} \quad (3)$$

Equation 3 sets forth the response of a doubly resonant system and the expression in the denominator can be solved to produce the approximate resonant frequencies as was performed on Equation 1 to obtain Equation 2, previously discussed. Equation 3 allows the frequencies and intermodal coupling of the two resonant modes to be adjusted by selection of the masses of the forward 21 and rear 23 head masses and the compliance of the compliant member 22. The two resonant frequencies for this embodiment can be more simply approximately as the resonance which the transducer would have if the head compliant member were removed and the resonant frequency of the head section alone if it were removed from the ceramic stack. However, a small amount of experimentation may be necessary to adjust the design to a final configuration because of such approximations.

Figure 6:
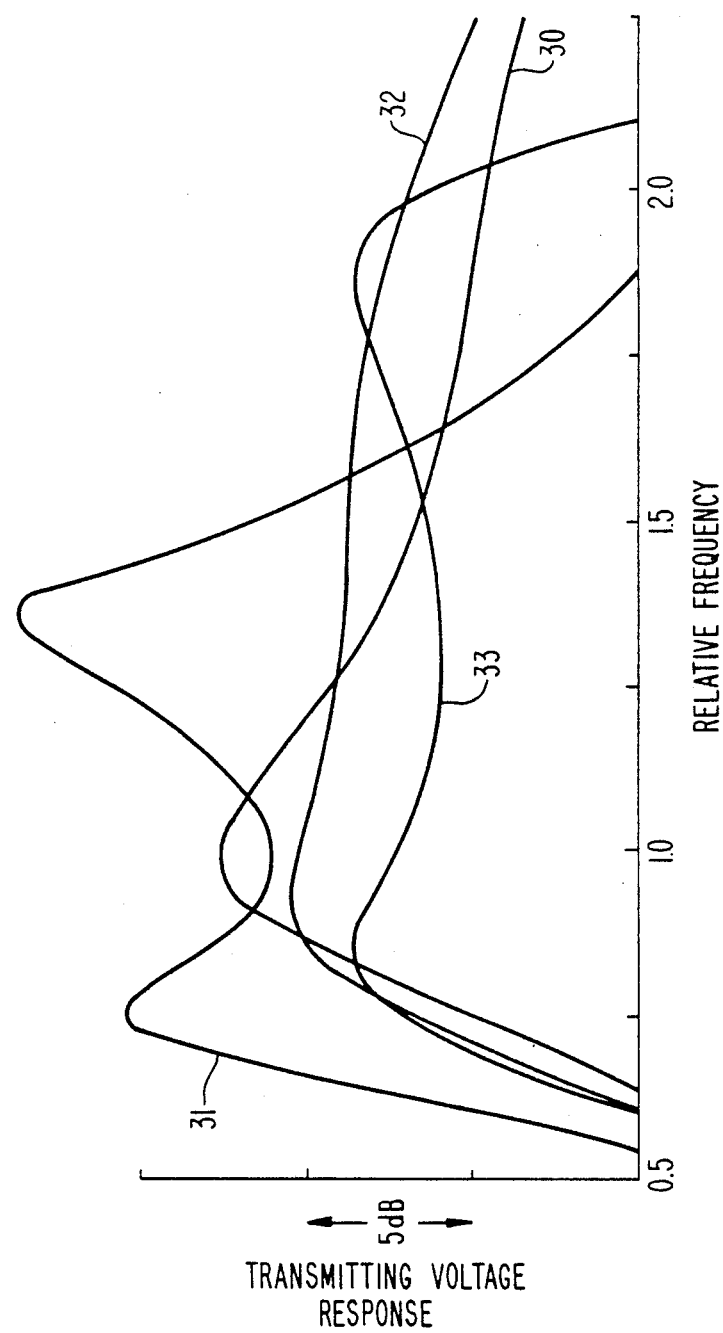
FIG. 6 provides a graphical comparison of the response of prior art transducers and the transducer of the present invention as illustrated in FIG. 4(a)

The computer program previously discussed was used to calculate the transmitting voltage response for this embodiment, as illustrated by curve 33 in FIG. 6. Curve 33 of FIG. 6 shows the response of the transducer of FIG. 4(a) without electrical terminating or tuning components. The transmitting voltage response illustrated was determined as defined by ANSI Transducer Standard S1.20-1972. As can be seen by the comparison of the prior art response curves (30, 31 and 32) with the response curve 33 for the present invention, the present invention results in a very much larger 3 dB (half power) frequency bandwidth than the prior art. The transducer curve 30 of the transducer of FIG. 1(a) provides a 3 dB bandwidth of approximately 0.36 frequency units; the prior art transducer tuned using electrical components, as illustrated by curve 31, provides a bandwidth of 0.39 units but with a higher signal level; and the prior art transducer using an external matching layer, as illustrated by curve 32, provides an approximately 1.12 unit bandwidth with a reduced signal level. In contrast, the present invention provides a 3 dB bandwidth of approximately 1.28 frequency units. The present invention also provides a relatively high signal level and a flat response curve while providing the increased bandwidth. A further advantage of the present invention is its superior performance in an array configuration. The present invention provides a high head impedance over a bandwidth of 1.18 units. The widest bandwidth of prior art devices without head impedance dips is in the matching layer device, where bandwidth is approximately 0.88 frequency units. The present invention also eliminates the need for matching layers by incorporating the function of such layers into the design of the transducer head section.

Figure 5:
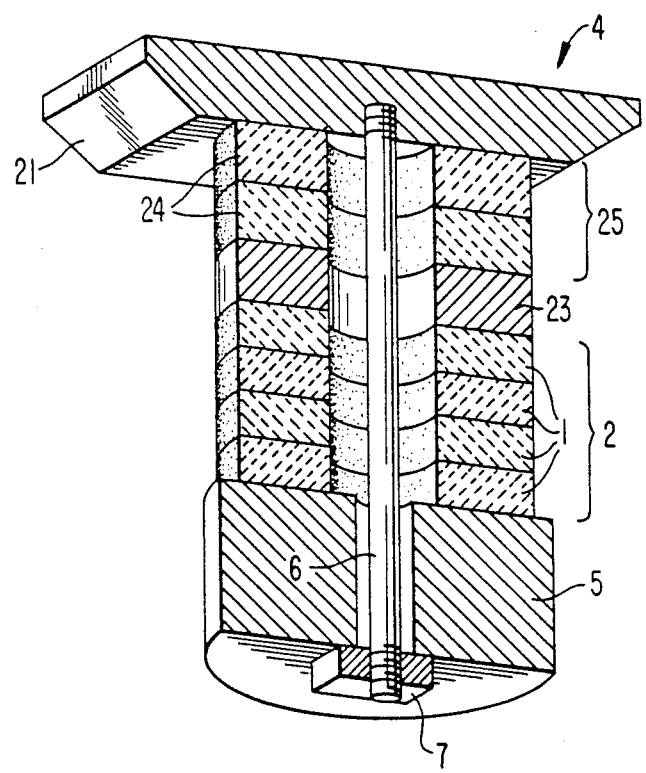
FIG. 5 illustrates another embodiment of the present invention where the compliant member 22 comprises active elements 24.

Another embodiment of the present invention is illustrated in FIG. 5. In this embodiment, the plastic compliant member 22 of FIG. 4(a) has been replaced by active transducer elements 24 providing a second active stack 25. The mass 23 then becomes an intermediate mass rather than a head mass. These active transducer elements 24 can be of the same material as transducer elements 1, however, different response characteristics can be obtained by using a different transducer material, such a barium titanate or piezoelectric crystals, such as lithium sulfate. In addition, the dimensions of the piezoelectric materials in the two stacks can be separately adjusted to meet particular design requirements, as illustrated by the different thicknesses of elements 24 and 1. The tail mass 5, in this embodiment, should be at least as massive as the sum of the masses of the head mass 21 and intermediate mass 23. It is preferred that the head mass 21 be less than or equal to the mass of the intermediate mass 23, so that the forward portion (21 and 25) resonates at the highest resonance frequency, however, it is possible to reverse the mass balance and get a reduced performance transducer. The resonant frequencies and response for this embodiment can be calculated in a manner similar to that for FIG. 4(a). As a design approximation, the low frequency resonance can be approximated by considering the masses 21, 25 and 23 as a single mass and the compliance of stack 2 in conjunction with tail mass 5. The high frequency resonance can be approximated as the resonance of parts 21, 23, and 25 if they were isolated from the rest of the transducer. In practice the actual low frequency resonance will be somewhat lower than the above approximation and the high frequency resonance will be somewhat higher.

The two active stacks 2 and 25 when acting as a transmitter can be driven by separate amplifer circuitry in some applications. However, in a preferred embodiment which allows simpler driving circuitry, the electrical leads from the two active stacks 2 and 25 are connected in parallel in such a way that a positive applied voltage causes one of the stacks to expand while the other contracts. In this configuration there is a small decrease in sensitivity (approximately 0.1 dB) at the low frequency resonance, and a significant increase in sensitivity (3 dB or more) at the high frequency resonance. This can be particularly advantageous in applications which require approximately equal transmitted power levels at all frequencies in a wide operating band. In contrast, the device of FIG. 4(a) provides approximately equal transmitted axial sound pressure levels as shown in curve 33 of FIG. 6, however, in this device a lower transmitted power level at high frequencies occurs because the device becomes more directive as the energy is radiated into a smaller angular region of space.

When the transducer is acting as a receiver the electrical leads could also be connected in parallel to simplify the required electrical circuitry.

FIG. 7 depicts the transmitted power at a constant drive voltage as a function of frequency for several transducer configurations according to the present invention. Curve 34 represents the power response for the prior art device of FIG. 1(a). Curve 35 is the power response for the device of the present invention using inactive compliance members in the head section as shown in FIG. 4(a), using the same design parameters as were used to calculate the transmitting voltage response of Curve 33 in FIG. 6. This device has a somewhat increased bandwidth for its power response, but the response at the high frequency peak is quite low. Curve 36 shows a similarity constructed transducer using active transducer elements in the head section as shown in FIG. 5. This device achieves a relatively flat power response at constant drive voltage throughout the bandwidth including both resonances.

A further modification of the present invention can include providing an extra connection between the stress rod 6 and rear head mass 23 of the compliant member 22, in addition to the rigid connection of the stress rod 6 to the forward head mass 21 and tail mass 5. Using equation 3 to adjust the masses and compliances of the elements of the transducer, it is also possible to provide a single transducer with two distinct operating bands. There is no fundamental limit to the frequency separation of the two bands. However, a practical limit is reached when the length of the ceramic stack is greater than one-quarter of the wavelength of sound in the ceramic material at the highest resonance frequency.

It is also possible to have a multitude of mass and compliant member layers. Such an embodiment having N mass layers will result in N resonant frequencies and if the peaks of the response curve are positioned sufficiently close together, a very flat response curve can be obtained.

The prior art methods of electrical termination and external matching layers are compatible with the present invention and the performance of the present invention can be further improved when used in combination with electrical components and/or matching layers, as will be recognized by those of skill in the art.

The many features and advantages of the present invention are apparent from the detailed specification and, thus, it is intended by the appended claims to cover all such features and advantages of the device which fall within the true spirit and scope of the invention. Further, since numerous modifications and changes will readily occur to those skilled in the art, it is not desired to limit the invention to the exact description and operation illustrated and described and, accordingly, all suitable modifications and equivalents may be resorted to falling within the scope of the invention.

I claim:

1. A longitudinal electromechanical transducer, comprising:
    a head section comprising:
        N head masses, where N is an integer greater than or equal to two; and
        N-1 compliant means, fixed between said head masses in a laminar structure, for coupling said head masses;
    electromechanical transducers, fixed to said head section, for providing electromechanical conversion; and
    a tail mass fixed to said electromechanical transducer means, said transducer allowing resonant vibration at at least N resonances within the operating band of said transducer.

2. A transducer as recited in claim 1, wherein said head section is a trilaminer head section.

3. A transducer as recited in claim 1, wherein said compliant means has a compliance substantially greater than metal and piezoelectric ceramic.

4. A longitudinal electromechanical transducer for radiating into a medium at an operating frequency, comprising:
    a head mass in contact with the medium and having a head mass length in a longitudinal vibration direction;
    a first electromechanical transducer element abutting said head mass;
    an intermediate mass abutting said first electromechanical transducer element and having an intermediate mass length in the longitudinal vibration direction;
    a second electromechanical transducer element abutting said intermediate mass; and
    a tail mass abutting said second electromechanical transducer element and having a tail mass length in the longitudinal vibration direction, said transducer providing two resonances within the operating band, said head, intermediate and tail mass length being substantially shorter than one-quarter wavelength at the operating frequency and the abutment between said transducer elements and said masses preventing significant compliancy decoupling.

5. A transducer as recited in claim 4, wherein said first and second electromechanical transducer elements are electrically connected in parallel.

6. A transducer as recited in claim 5, wherein the electrical connection allows one of said first or second electromechanical transducer elements to expand while the other contracts.

7. A transducer as recited in claim 4, wherein said first electromechanical transducer element comprises a first transducer material and said second electromechanical transducer element comprises a second transducer material different from the first transducer material.

8. A transducer as recited in claim 4, wherein said first electromechanical transducer element has a first thickness and said second electromechanical transducer element has a second thickness different from the first thickness.

* * * * *